United States Patent [19]

Handy

[11] 4,272,759
[45] * Jun. 9, 1981

[54] 16 BIT ANALOG TO DIGITAL CONVERTER

[75] Inventor: Roland J. Handy, Northridge, Calif.

[73] Assignee: Xerox Corporation, Stamford, Conn.

[*] Notice: The portion of the term of this patent subsequent to Dec. 16, 1997, has been disclaimed.

[21] Appl. No.: 918,254

[22] Filed: Jun. 23, 1978

[51] Int. Cl.³ .......................................... H03K 13/02
[52] U.S. Cl. ........................ 340/347 AD; 340/347 M; 357/24
[58] Field of Search ................... 340/347 M, 347 AD; 357/24; 307/221 C, 221 D

[56] References Cited

U.S. PATENT DOCUMENTS

| | | | |
|---|---|---|---|
| 3,903,543 | 9/1975 | Smith | 357/24 |
| 3,930,255 | 12/1975 | Means | 340/347 AD |
| 3,958,210 | 5/1976 | Levine | 307/304 X |
| 4,058,717 | 11/1977 | Engeler | 357/24 X |
| 4,072,938 | 2/1978 | Buchanan | 340/347 AD |
| 4,087,812 | 5/1978 | Terman | 357/24 X |
| 4,115,766 | 9/1978 | Smith | 357/24 X |
| 4,136,335 | 1/1979 | Tompsett | 357/24 X |

OTHER PUBLICATIONS

Mok et al., A Charge-Transfer-Device Logic Cell, Solid-State Electronics, 1974, vol. 17, pp. 1147-1154.

Primary Examiner—Thomas J. Sloyan
Attorney, Agent, or Firm—Franklyn C. Weiss

[57] ABSTRACT

Utilizing a plurality of analog to digital converter cells with transfer gates as implemented by large scale integrated circuit techniques incorporating charge coupled device technology, a 16 bit or larger analog to digital converter is achieved. On a single integrated circuit chip, the necessary A/D cells are formed, whereby in each cell gate and charge packet transfer paths allow for the analog to digital conversion. With transfer gates coupling the A/D cells, the multi-bit A/D conversion register is constructed. Digital voltage levels indicative of logic 0's or logic 1's are generated from varying analog charge levels applied.

3 Claims, 3 Drawing Figures

16 BIT ANALOG TO DIGITAL CONVERTER

BACKGROUND OF THE INVENTION

Charge-coupled semiconductor devices were first described in an article of similar title as published in the Bell System Technical Journal, Volume 49, Number 4, 1970, pages 587 to 593. Since that time much research has been conducted on CCD's to the present time wherein 64 kilobit single chip CCD memories have reached the commercial marketplace. (IEEE Spectrum, May 1978, page 36).

Memories are not the only use for CCD's, however. CCD's can be utilized in image sensing arrays and also for analog signal processors (Electronic Design 6, Mar. 15, 1976, page 70). However, the prior art does not show the use of CCD technology in analog to digital signal conversion wherein the actual conversion is accomplished directly on the CCD integrated circuit chip itself. Such a device would reduce the number of CCD and other type integrated circuit chips and increase signal to noise, amplification ratios, etc., due to the fact that the entire analog to digital conversion is done on one device.

As large scale integrated circuit techniques are extensive in the modern technology, construction of more than one such analog to digital conversion circuit on one chip is possible. Thus, coupling the CCD A/D conversion circuits together by transfer gate technology would lead to construction of multi-stage analog to digital conversion on a single LSI chip utilizing CCD technology.

SUMMARY OF THE INVENTION

The present invention provides a charge-coupled device technology, single integrated circuit chip whereupon multi-stage analog to digital signal conversion takes place. Charge is deposited under an input gate A by transfer of a packet of charge from a preceding gate, for example, or by generation of charge packets at a photosite on the chip as in an image system. By use of a floating gate master FGM and a floating gate slave FGS, certain levels of charge detected at the input gate will be detected, which allows the floating gate slave FGS gate to determine which output will be present, as fully described in the body of the present application. The voltage outputs of the circuit are the digital logic levels representative of the input analog signal.

If each of said circuits are termed "cells", coupling more than one cell to another will allow for multi-bit outputs to be generated in increasing resolution depending on the number of stages. That is, if 16 cells are coupled together, 16 levels of gray can be detected, if used in an imaging system for example, or 16 discrete digital voltage levels can be detected from the input analog signals. Transfer gates are used to couple successive cells to each other to provide conduction paths for the packets of charge generated.

OBJECTS OF THE PRESENT INVENTION

It is, therefore, an object of the present invention to utilize charge-coupled transfer technology for multi-stage analog to digital signal conversion.

It is another object of the present invention to utilize charge packet transfer on an integrated circuit chip to effect multi-stage analog to digital signal conversion.

It is a further object of the present invention to provide multi-stage analog to digital signal conversion by utilizing charge-coupled technology on a single integrated circuit.

It is another object of the present invention to utilize a plurality of charge coupled technology devices in a multi-stage analog to digital converter.

It is another object of the present invention to provide multi-stage analog to digital signal conversion by utilizing a plurality of charge-coupled technology devices on a single integrated circuit.

DESCRIPTION OF THE DRAWINGS

For a more complete understanding of the invention as well as other objects and further features thereof, reference may be had to the following detailed description of the invention in conjunction with the drawings wherein.

DETAILED DESCRIPTION OF THE INVENTION

Charge coupled devices are inherently analog devices due to the fact that the charge packets associated with each individual charge coupled device on a silicon substrate vary from zero to a predetermined maximum value, depending upon the applied voltage to that particular CCD. Thus, charge coupled devices are ideal for use wherein an input signal is of an analog nature which can be subsequently utilized with subsequent circuitry for modifying, encoding, amplifying, etc., any particular signal output. Further, CCD's lend themselves to large scale integrated circuit techniques for manufacture where the density of the circuits on a substrate chip run into the thousands and which allow CCD's to be valuable in analog situations. In certain instances, an analog signal is desired to be converted to digital signals, and many such techniques are old in the art, as analog to digital conversion is a well known technique and has been for many years. However, analog to digital conversion using charge transfer technology in a charge coupled device is a new concept and the art is sparse in this area. One such reference is entitled "An Analog to Digital Converter Using Charge Transfer Technology" on Page 4 of the 1977 IEEE International Solid State Circuits Conference Proceedings.

However, a charge coupled device which is able to convert a signal from analog to digital form on one integrated circuit chip has not been disclosed in the prior art previous to the present copending application, serial Number D/78043, and assigned to the same assignee.

The obvious advantages of utilizing analog to digital conversion on a single chip are many fold. For example, converting an analog signal to a digital signal within the confines of a single charge coupled device integrated circuit chip allows for much higher accuracy in the conversion process because the obvious use of fewer circuits and components decreases the chances for error, noise, etc. Further, analog to digital conversion on a single integrated circuit chip allows for immediate digital operation in essentially an analog environment.

Figure 1:
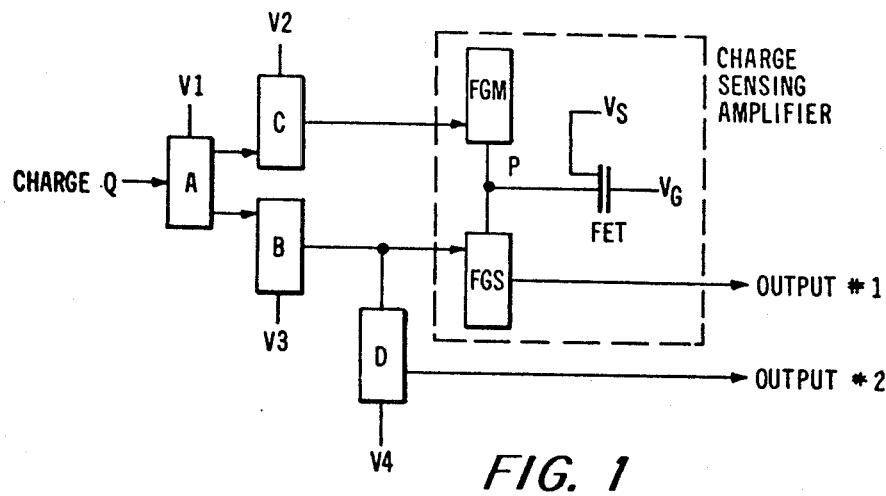
FIG. 1 is a schematic representation of an analog to digital signal converter cell utilizing the charge-coupled transfer technology.
Figure 2:
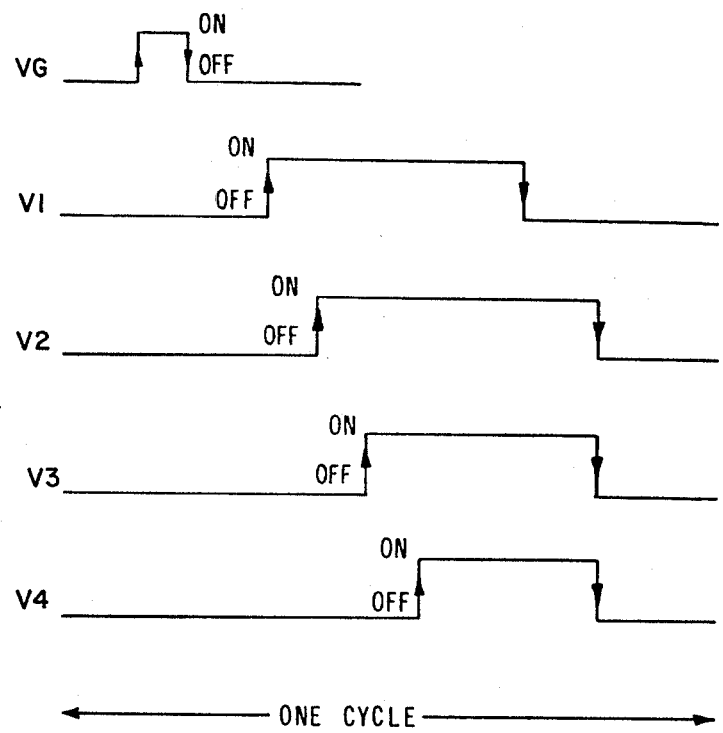
FIG. 2 is a timing diagram of the application of voltage signals to the converter described in conjunction with FIG. 1.

FIG. 1 shows a typical cell embodying the principles of the present invention. Since the individual gates and other components shown in FIG. 1 may be part of a larger integrated circuit, the arrows shown are not strictly electrical connections in the typical sense, but are paths for which either a charge or a voltage is applied or for charge to be moved from one area to another on the integrated circuit chip. Thus, FIG. 1 shows an input gate A and as an input to the gate there is a charge path for which charge may be applied to the gate. Also, connected to input gate A is a voltage V1 which is applied to establish the depth of the depletion layer to establish the amount of charge that can be stored in the input gate. FIG. 2 depicts a timing diagram for the application of the various voltage potentials. From input gate A is shown two arrows which denote paths of movement of charge from this depletion layer to gates B and C. Coupled to the input of gate B is voltage V3 and coupled to gate C is voltage V2 which establishes the depletion layers for these gates, respectively.

Also shown in FIG. 1 is a charge sensing amplifier CSA which comprises a floating gate master FGM and floating gate slave FGS which are coupled together to the field effect transistor FET. Shown coupled to the intersection of the line from the FGM and the FGS is a line coupled to the source of the field effect transistor FET. Coupled to the drain of the FET is voltage VS and coupled to the gate of the FET is voltage VG. Also coupled to the path between gate B and the FGS is gate D which has an input of voltage V4. The output from the FGS is considered Output Number 1 and the output of gate D is considered the Output Number 2. These outputs have on the line a voltage level of a logic zero or a voltage level of a logic one in binary terms. This is a digital output which can be used for a subsequent operation either on the integrated circuit chip itself or directed to an output circuit as will be discussed below. However, it is to be understood that an analog charge Q applied to analog gate A generates, in a manner to be hereinafter described, voltage signals on Outputs Number 1 and 2 which are seen to be digital.

The charge input into input gate A for purposes of explaining the operation of the circuit in FIG. 1, is, for ease of description, defined at being at 2Q. This charge can be generated in any of the known manners for use in operating a charge coupled device, such as from another stage in a charge coupled device or from the use of the charge coupled device in an imaging technique wherein light impinges upon a photosite, such as is used when CCD's are used in an imaging environment. If the charge of 2Q is dumped under input gate A when the predetermined voltage V1 is applied to gate A, the depletion layer formed at gate A by the voltage will be quickly filled with the charge in the manner known in the art in the operation of charge coupled devices. As described above, CCD gates C and B are coupled to the output of gate A. Upon application of voltage V2 (See FIG. 2) on gate C, and if the voltage V2 is also carefully predetermined, the excess charge of 1Q occupying the depletion layer in gate A will be quickly transferred to gate C in the normal CCD charge transfer technique. In the charge sensing amplifier, CSA, the voltage VS is applied to the drain terminal of the field effect transistor FET which is part of the integrated circuit on the chip along with the rest of the CCD circuit being described herein. When voltage VG is applied to the field effect transistor FET at the gate terminal, the voltage VS is immediately applied to point P which is shown to be between the floating gate master FGM and the floating gate slave FGS. Once voltage VS is applied to point P, voltage VG is turned off and the voltage VS will remain at point P. Thus, in order to energize initially the FGM and the FGS, voltage VG will be applied prior to applying voltage V1 to input gate A. If voltage VG had been applied initially as just explained, when voltage V2 is applied to gate C, and there is an excess charge of Q in the input gate A, this charge will be transferred through gate C to the FGM. When charge is deposited under the FGM gate, the surface potential under the FGS gate will be changed toward zero volts.

Returning to input gate A, the remaining charge Q is detected at gate B and is transferred, when voltage V3 is applied to gate B to the FGS. Since the FGS surface potential has increased from its initial position, because of charge being deposited under the FGM gate, the charge under gate B, if there is any, will be blocked by the surface potential barrier under the FGS gate. Thus, the output number 1 of the FGS will remain at a logic zero. However, since the charge from gate B has not been transferred through the FGS gate, then when voltage V4 is applied to gate D, gate D will now have the charge transfer from gate B to gate D, and thus at the application of voltage V4 the charge will be transferred through gate D to the output number 2 and detected as a logic one. Thus, when a charge of 2Q or maximum charge to fill input gate A is applied to gate A, Output 1 will have a logic zero and Output 2 will have a logic one.

Assume now that only a charge of Q is applied to gate A. Voltage VG had been applied to the FET and thus voltage VS appears at point P between FGM and FGS. Since there is no excess charge greater than Q under gate A after application of voltage V1, upon the application of voltage V2 to gate C, no excess charge is transferred via gate C from gate A to the FGM. Accordingly, there is no change of the surface potential of the FGS from the influence of the FGM. Therefore, when voltage V3 is applied to gate B, the charge Q in gate A will be transferred to gate B. However, as voltage VS appears at point P, FGS is enabled and thus when voltage V3 is applied to gate B, the charge Q on gate A will be transferred via gate B to the FGS which now detects the charge and the Output Number 1 may be considered, therefore, to be a logic one. When it comes time for voltage V4 to be applied to gate D, no charge remains on input gate A to be transferred via gate B and thus Output 2 is considered a logic zero. Thus, when only a charge of Q appears at input Gate A, Output 1 is a logic one and Output 2 is a logic zero.

When the input charge to gate A is zero, no charge can be transferred to either FGM or gate D and thus the output at Outputs 1 and 2 are both logic zero. Accordingly, it is apparent then that depending upon the charge level applied to the input gate A, the output from Outputs 1 and 2 will be the logic levels as set forth above. Further, a charge applied to gate A less than Q will render Output 1 at logic one and Output 2 at logic zero. Thus, the cell described logic zero. Thus, the cell described in FIG. 1 will operate as a true analog to digital converter. For ease of description, the input charge was defined as 2Q. The charge, in actuality, can be any defined level, the circuit will divide the charge in half.

The description above has related to the description of how one CCD cell effects the analog to digital conversion. By the use of a plurality of these cells and transfer gates to couple them together, the multi-stage analog to digital converter of the present invention can be constructed.

Figure 3:
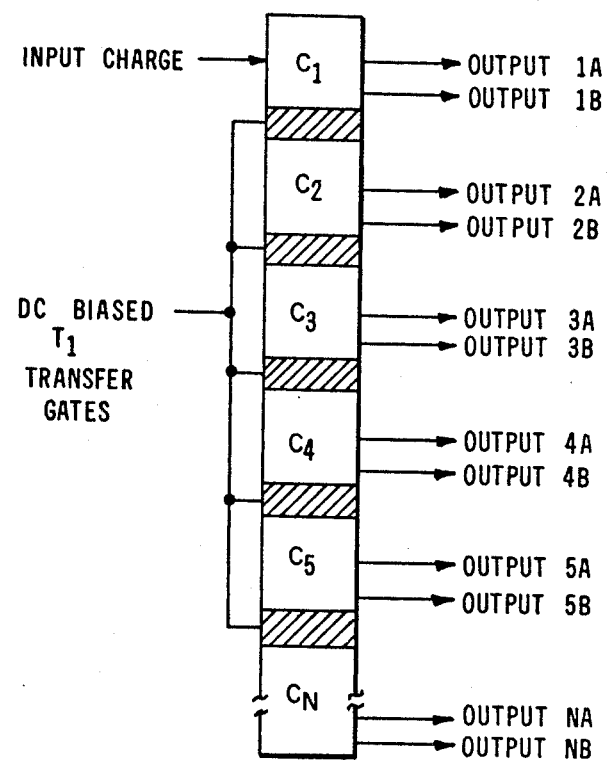
FIG. 3 is a schematic representation of the multi-stage analog to digital converter utilizing a plurality of cells shown and described in conjunction with FIGS. 1 and 2.

Attention is now drawn to FIG. 3. Each rectangle with a C in it is representative of one CCD cell described above in configuration with FIGS. 1 and 2. For convenience, the various inputs and outputs of the single cell described above will be listed here:

2Q input, Output Number 1 is logic 0.
2Q input, Output Number 2 is logic 1.
1Q input, Output Number 1 is logic 1.
1Q input, Output Number 2 is logic 0.
No input, Output Number 1 is logic 0.
No input, Output Number 2 is logic 0.

FIG. 3 depicts at least five of such cells with a possibility of N cells. Only the state of the art in the manufacture of integrated circuits limits the number of cells that may be constructed on a single silicon chip. Each of the cells has an input to a gate A as seen in FIG. 1. However, only cell C1 in FIG. 3 receives an input charge from an external source. The other input gates receive the excess charge packets over and above what is capable of saturating the depletion layer in gate A of cell 1. This excess charge is transferred from cell 1 to cell 2 towards cell N, filling each depletion layer on its way, by means of the transfer gates constructed between the input gates A of the plurality of cells in the register or array.

Each of these cells operates in the same manner. For example, if the cell receives the defined charge of 2Q, Output 1 would be a logic zero and Output 2 would be a logic one. Thus, if cell C5 received a charge of 2Q, for example, Output 5A would be a logic zero and Output 5B would be a logic one, and so forth.

Referring to FIG. 3, it is to be assumed for purposes of illustration that the input charge to cell C1 is 7Q. Cell C1 would fill its depletion layer to 2Q and 5Q would spill over to cell C2. Cell C2 would fill its depletion layer to 2Q and 3Q would spill over to cell C3. Cell C3 would fill its depletion layer to 2Q and 1Q would spill over to cell C4. Cell C5 received no charge at all. Referring to the chart above, the outputs from cells C1, C2, and C3 would be the same, or logic zero and logic one respectively from the Outputs A and B. Cell C4, having only received 1Q of charge would have at its outputs 4A and 4B, logic one and logic zero, respectively. Cell C5, having received no charge at all, would have at its outputs 5A and 5B, logic zero and logic zero, respectively. Depending on the amount of input charge received and the number of cells, the Outputs of the respective cells will have a representative number of cells with its Outputs the same, (cells C1, C2 C3, for example), one cell could have a transition logic level (cell C4, for example), and the remaining cells could have its outputs the same, but opposed to the first group of cells (cells C5 to CN, for example).

It can, therefore, be clearly seen that the multi-stage array as set forth in FIG. 3 generates digital signals specifically related to the applied analog signal. This invention has application whenever analog signals must be converted to a multi-level digital signal. For example, in data transmission modems, it may be desired to convert the analog signal to a multi-level digital signal, with each level encoded at a different transmission frequency. The present invention would accomplish the analog to digital conversion on a single CCD integrated circuit chip.

Another application of the invention described herein is in the use with image devices. An image can be scanned and a signal generated, as at the output of a photocell, for example. Or the light may impinge directly on a photosite on the CCD integrated circuit directly. In any event, the charge, defined as Q, is generated in proportion to the amount of light received from the image. (Or the reverse if a reverse or negative image is scanned or desired). If, for instance, there were sixteen cells in the array described in conjunction with FIG. 3, the light level would have been discerned to change at the output level generated by Cell c4. Cells C1 to C3 would be a value lighter than the detected level while cells C5 to C16 would be a value darker than the detected level. Or it can be said that the light received was level 4 on a gray scale range of 1 to 16.

Subsequent logic circuitry coupled to the outputs of the cells can be used for detection, encoding, etc., of the detected gray levels. This logic circuitry could be part of the integrated circuit or external to the integrated circuit. In one instance, for example, the logic levels from Outputs 1 and 2 from each cell of logic zero and logic one could be searched for alone, because all the values above this cell would be the same while all the value below the cell would be the same, but different of course from the opposite level detected. This would mean that only the outputs from one cell have to be encoded, because the other cells' outputs may be redundant.

This invention would readily be adaptable for considerable use and value in an imaging system where analog to digital conversion is a necessity. Facsimile and digital television transmission are typical examples.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. In an analog to digital converter wherein on a single integrated circuit chip utilizing charge transfer technology is a cell comprising input gate means for receiving an input analog signal represented by packets of charge; transfer gate means coupled to said input gate means for transferring any such packets of charge; said transfer gate means comprising first and second transfer gates in charge packet transfer relationship with said input gate means, said first transfer gate transferring an excess of a predetermined charge, and said second transfer gate transferring a charge at or below said predetermined charge, the charge levels being determined by the depletion levels established by applied voltage levels; output gate means including charge sensing amplifier gate means coupled to said transfer gate means for detecting the presence of charged transferred, an excess of charge transferred, or no charge transferred, the output of said output gate means being a pair of digital logic voltage signals indicitive of these three conditions, said charge sensing amplifier means comprising a master gate and a slave gate in charge packet transfer relationship with said first and second transfer gates, said master and slave gates having an externally applied voltage potential thereto which is independent from other applied voltages, said master gate inducing a change in the potential in said slave gate whereby said slave gate blocks the transfer of charge from said second transfer gate when said master gate detects an excess charge transferred by said first transfer gate; the improvement comprising:

a plurality of said cells arranged on said single integrated circuit chip in charge transfer proximity to thereby form an analog to digital register of said plurality of cells, said register including an additional transfer gate between said cells to effect charge transfer from cell to cell, whereby charges in excess of that capable of being transferred within a first cell are transferred to said second cell by said transfer gate and on through the register until all the incoming charge is transferable within the cells, the output of these cells being of a different logic configuration than those cells to which no charge was transferred, thereby indicating a digital logic signal representation of the input analog charge level.

2. The analog to digital converter as set forth in claim 1 wherein the output signals from said register is indicative of a level of gray if the input analog charge applied to said converter is representative of an image signal of varying shading levels.

3. The analog to digital converter as set forth in claim 1 wherein the output signal is a digital logic representation of the applied analog charge level according to the following ratio r $$\text{ratio } r = S/N$$

where S is the number of the stage in the converter wherein the output signals of the first stages of the converter change in relation to the remaining stages of the converter, and N is the number of cells or stages in the converter.

* * * * *